United States Patent
Ghazali et al.

(10) Patent No.: US 6,943,598 B2
(45) Date of Patent: Sep. 13, 2005

(54) REDUCED-SIZE INTEGRATED PHASE-LOCKED LOOP

(75) Inventors: Mostafa Ghazali, Grenoble (FR); Pierre-Olivier Jouffre, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/776,931

(22) Filed: Feb. 11, 2004

(65) Prior Publication Data

US 2004/0212410 A1 Oct. 28, 2004

(30) Foreign Application Priority Data

Feb. 11, 2003 (FR) .......................................... 03 01623

(51) Int. Cl.[7] ................................................ H03L 7/06
(52) U.S. Cl. ...................................... 327/147; 327/156
(58) Field of Search .............................. 327/147, 148, 327/151, 155, 157, 160, 162, 163; 331/17, 25, DIG. 2; 375/373, 375, 376

(56) References Cited

U.S. PATENT DOCUMENTS

| | | | |
|---|---|---|---|
| 6,590,376 B1 * | 7/2003 | Bammert et al. | 324/76.41 |
| 2001/0005408 A1 | 6/2001 | Neukom | 375/376 |
| 2001/0036239 A1 * | 11/2001 | Oka | 375/376 |
| 2002/0033737 A1 | 3/2002 | Staszewski et al. | 331/17 |

* cited by examiner

*Primary Examiner*—Linh My Nguyen
(74) *Attorney, Agent, or Firm*—Lisa K. Jorgenson; David V. Carlson; SEED IP Law Group PLLC

(57) ABSTRACT

A phase-locked loop comprising a comparator generating a control voltage depending on the phase-shift between a reference signal and a feedback signal, an oscillator controlled by the control voltage, generating several phase-shifted signals of same period, one of which forms the output signal of the phase-locked loop, a multiplexer capable of providing any of the phase-shifted signals to the input of a divider, the output of which forms the feedback signal, and a means controlling the multiplexer to successively provide fractions of the phase-shifted signals, so that the divider receives a signal having an average period equal to a real fraction of the period of the phase-shifted signals.

5 Claims, 3 Drawing Sheets

REDUCED-SIZE INTEGRATED PHASE-LOCKED LOOP

BACKGROUND OF THE INVENTION

1. Field of the Invention

The present invention relates to the field of phase-locked loops and in particular to that of phase-locked loops of frequency synthesizers made in the form of integrated circuits.

2. Discussion of the Related Art

FIG. 1 schematically shows an example of a phase-locked loop of a frequency synthesizer. A quartz oscillator 1 generates a reference signal REF having a reference frequency Fref. A comparator 2 comprises a phase detector 3 receiving signal REF and a feedback signal FDBK. A charge pump 4 is coupled to the output of detector 3. Charge pump 4 generates a current Icom depending on the phase-shift between the signals received by detector 3. Current Icom is filtered and transformed into a control voltage Vcom by an RC-type filter 5. A variable-frequency oscillator 6 (VCO) controlled by control voltage Vcom generates an output signal OUT having a frequency Fout. A frequency divider 8 generates, based on signal OUT, feedback signal FDBK having a frequency equal to frequency Fout divided by a programmable integral value N. When the phase-locked loop is stabilized, the frequencies of signals Fref and FDBK are equal and one has:

$$Fout = N \cdot Fref$$

It is desirable in a frequency synthesizer to be able to accurately set frequency Fout within an extended range of values. It is further desirable for frequency Fref to be as high as possible, to reduce the size of the capacitors of filter 5 of comparator 2. Large capacitors are indeed expensive in an integrated circuit.

One prior art solution consists of periodically modifying value N according to a sigma/delta modulation pattern so that divider 8 divides in average the frequency of signal OUT by a real value ranging between value N and a value N+1. Such a modulation however introduces on feedback signal FDBK a phase error which must be corrected in comparator 2 by using in filter 5 capacitors still having a significant size. Further, such a modulation introduces an unwanted jitter in the phase-locked loop.

Another solution to increase the accuracy of the phase-locked loop consists of multiplying the frequency of output signal OUT of the loop by an accurately-programmable real value. Such a multiplication may be performed by a multiplexer receiving on a plurality of inputs a plurality of phase-shifted replicas of signal OUT. The multiplexer is controlled according to a sigma/delta modulation pattern to output from the multiplexer a signal having an average period equal to the period of signal OUT multiplied by a programmable real fractional number. The sigma/delta modulation however introduces on the multiplexer's output signal a jitter and a phase error which make such a solution impossible to use for a large number of applications.

SUMMARY OF THE INVENTION

An object of the present invention is to provide a phase-locked loop generating a frequency Fout accurately adjustable within an extended frequency range, and using small-size capacitors.

Another object of the present invention is to provide such a phaselocked loop generating a frequency Fout with a small jitter.

To achieve these objects, the present invention provides a phase-locked loop comprising a comparator generating a control voltage depending on the phase-shift between a predetermined reference signal and a feedback signal, an oscillator controlled by the control voltage, generating a plurality of phase-shifted signals of same period, one of the phase-shifted signals forming the output signal of the phase-locked loop, a multiplexer capable of providing any of the phase-shifted signals to the input of a divider having a fixed predetermined dividing ratio (N), the output of which forms the feedback signal, and a control means controlling the multiplexer to successively provide predetermined fractions of some of the phase-shifted signals, so that the divider receives a signal having an average period equal to a real fraction of the period of the phase-shifted signals.

According to an embodiment of the present invention, the voltage-controlled oscillator generates a number n of phase-shifted signals of same period Tout so that the phase-shifted signal forming the output signal of the loop is ahead of each of the other phase-shifted signals by a duration equal to an integral multiple of a duration Tout/n, each of the phase-shifted signals consisting in a periodic pulse having a duration shorter than duration Tout/n.

According to an embodiment of the present invention, the control means is a sigma/delta modulator controlling the multiplexer so that the divider receives a signal, the average period of which is equal to the sum of duration Tout/n multiplied by a first programmable integer M ranging between 0 and n−1 and of duration Tout/n multiplied by a second programmable integer x coded over a number u of bits and divided by $2^u$.

According to an embodiment of the present invention, the period of the signals generated by the oscillator depends on the control voltage.

According to an embodiment of the present invention, the comparator comprises a phase detector receiving as an input the reference signal and the feedback signal, a charge pump coupled at the output of the phase detector, generating a current signal depending on the phase difference between the reference and feedback signals, and a filter generating the control voltage based on the current signal.

The foregoing objects, features, and advantages of the present invention will be discussed in detail in the following non-limiting description of specific embodiments in connection with the accompanying drawings.

DETAILED DESCRIPTION OF THE INVENTION

Figure 1:
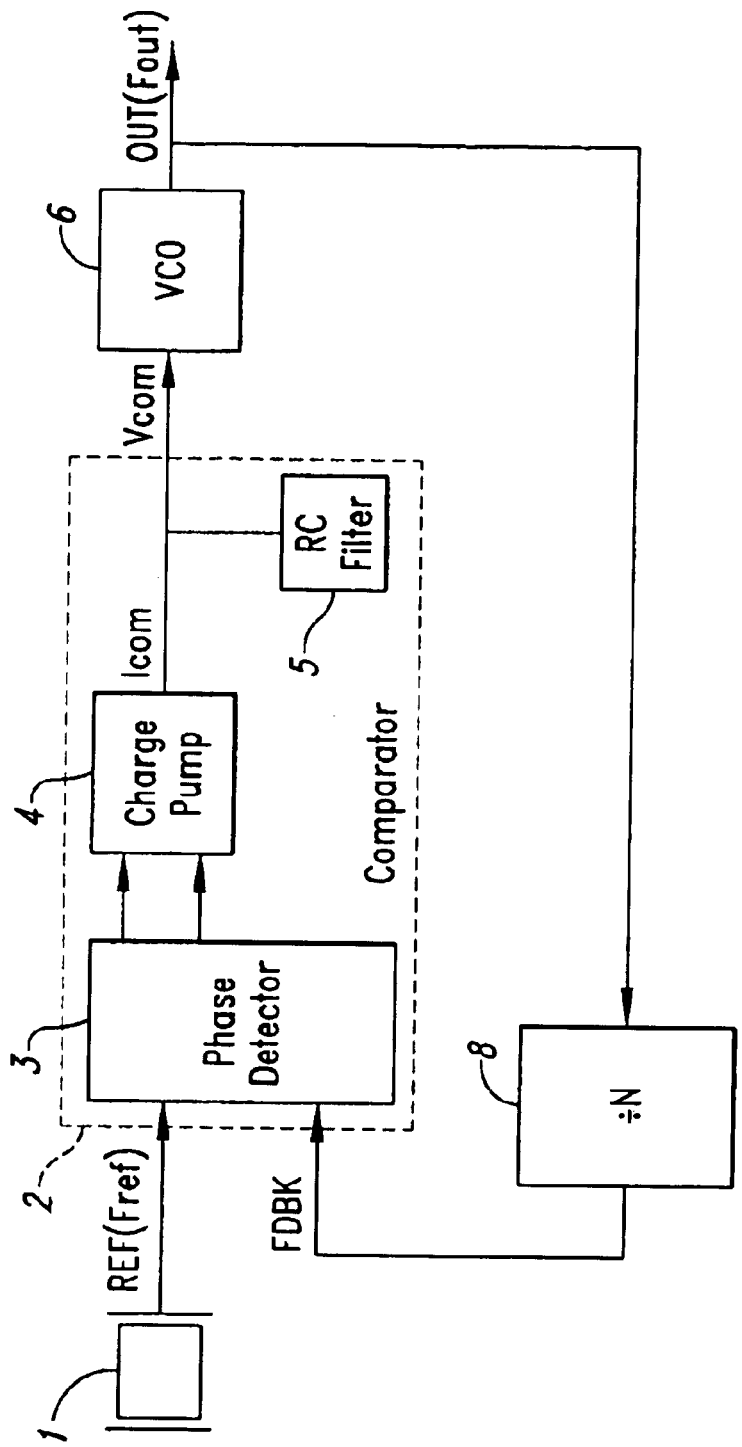
FIG. 1, previously described, schematically shows a conventional locked-locked loop.

Same reference numerals designate same elements in the different drawings. Only those elements that are necessary to the understanding of the present invention have been shown and other elements may be present in a practical application.

Figure 2:
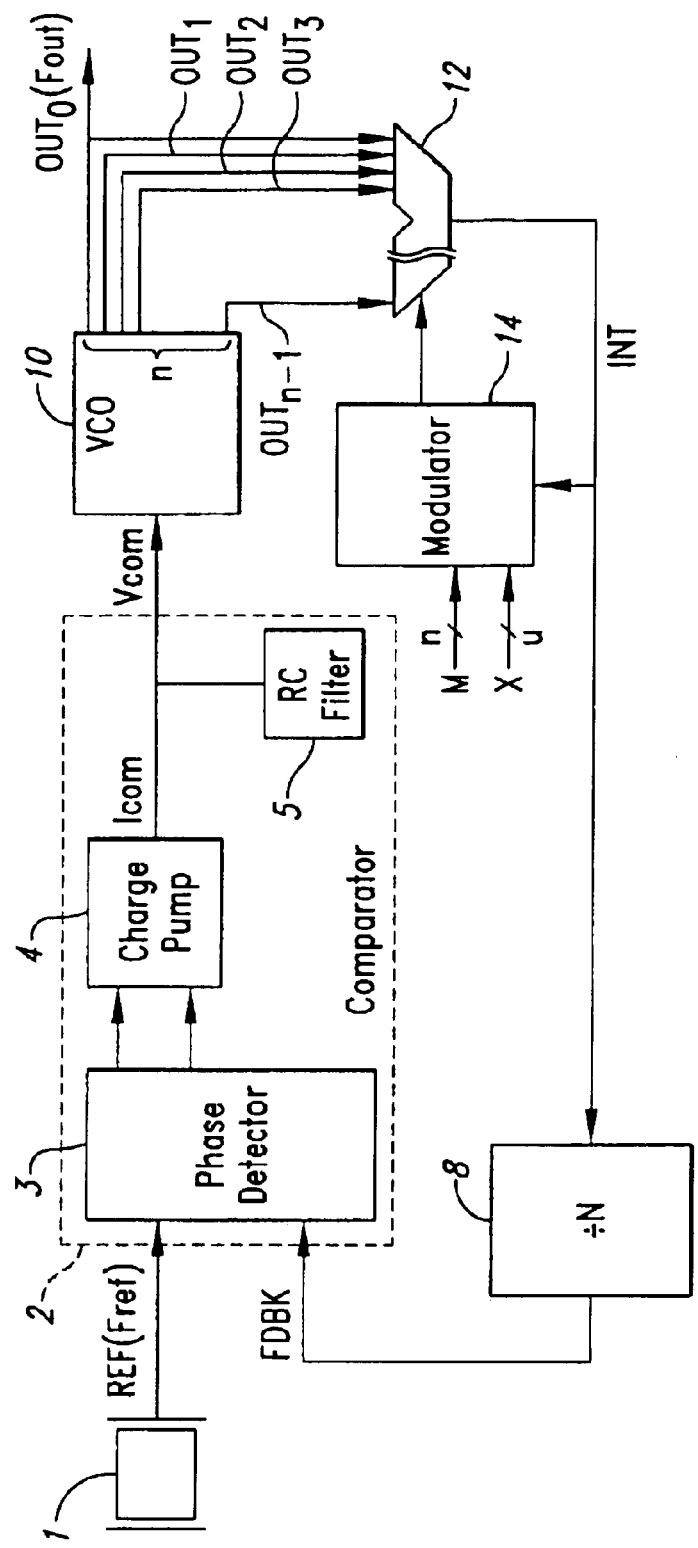
FIG. 2 schematically shows a phase-locked loop according to the present invention.

FIG. 2 schematically shows a phase-locked loop according to the present invention, comprising as in FIG. 1 a quartz 1 generating a reference signal REF and a comparator 2 generating a control voltage Vcom depending on the phase-shift between reference signal REF and a signal FDBK generated by a divider 8 having a fixed predetermined dividing ratio (N). Comparator 2 comprises as in FIG. 1 a phase detector 3, a charge pump 4, and a filter 5. According to the present invention, an-oscillator 10 controlled by control voltage Vcom and comprising a number n of output terminals phase-shifted by $2\pi/n$ with respect to one another is used. A first output terminal generates an output signal $OUT_0$ of the loop. Period Tout of signal $OUT_0$ depends on control voltage Vcom. A multiplexer 12 receives the n outputs of oscillator 10. The output terminal of multiplexer 12 provides a signal INT to the input of divider 8. A sigma/delta modulator 14 is connected to the control terminals of multiplexer 12. Modulator 14 receives from a control means, not shown since it is conventional, a programmable value M ranging between 0 and n−1 and a programmable value x coded over a number u of bits, and operates synchronously with signal INT.

Oscillator 10 generates on its output terminals $OUT_1$, $OUT_2$, ... $OUT_{n-1}$ signals of same period Tout as signal $OUT_0$, respectively phase-shifted by durations equal to T/n, 2T/n, ... (n−1)T/n with respect to signal $OUT_0$. Modulator 14 controls multiplexer 12 according to a sigma/delta modulation pattern so that signal INT has an average period equal to the sum of duration T/n multiplied by value M and of duration T/n multiplied by value $x/2^u$. If Tint is the average period of signal INT, one thus has:

$$Tint=(M+x/2^u).Tout/n, \quad (1)$$

whereby, If Fint is the average frequency of signal INT, and Fout is the frequency of the output signal:

$$Fint=Fout.n/(M+x/2^u)$$

As will be seen hereafter, the variations in the instantaneous period of signal INT introduce a phase error in comparator 2. This phase error is damped by filter 5, and when the loop is stabilized, it can be considered to have:

$$Fref=Fint/N,$$

whereby:

$$Fout=Fref.N.(M+x/2^u)/n \quad (2)$$

From the reading of above formula (2), there appears that the smallest possible variation ΔFout of frequency Fout, which defines the accuracy of the phase-locked loop, is:

$$\Delta Fout=Fref.N/(n.2^u)$$

An appropriate choice of value N, of number n of oscillator outputs, and of number u of bits over which value x is coded thus enables accurately varying frequency Fout over an extended range of values while keeping a high frequency Fref.

Figure 3:
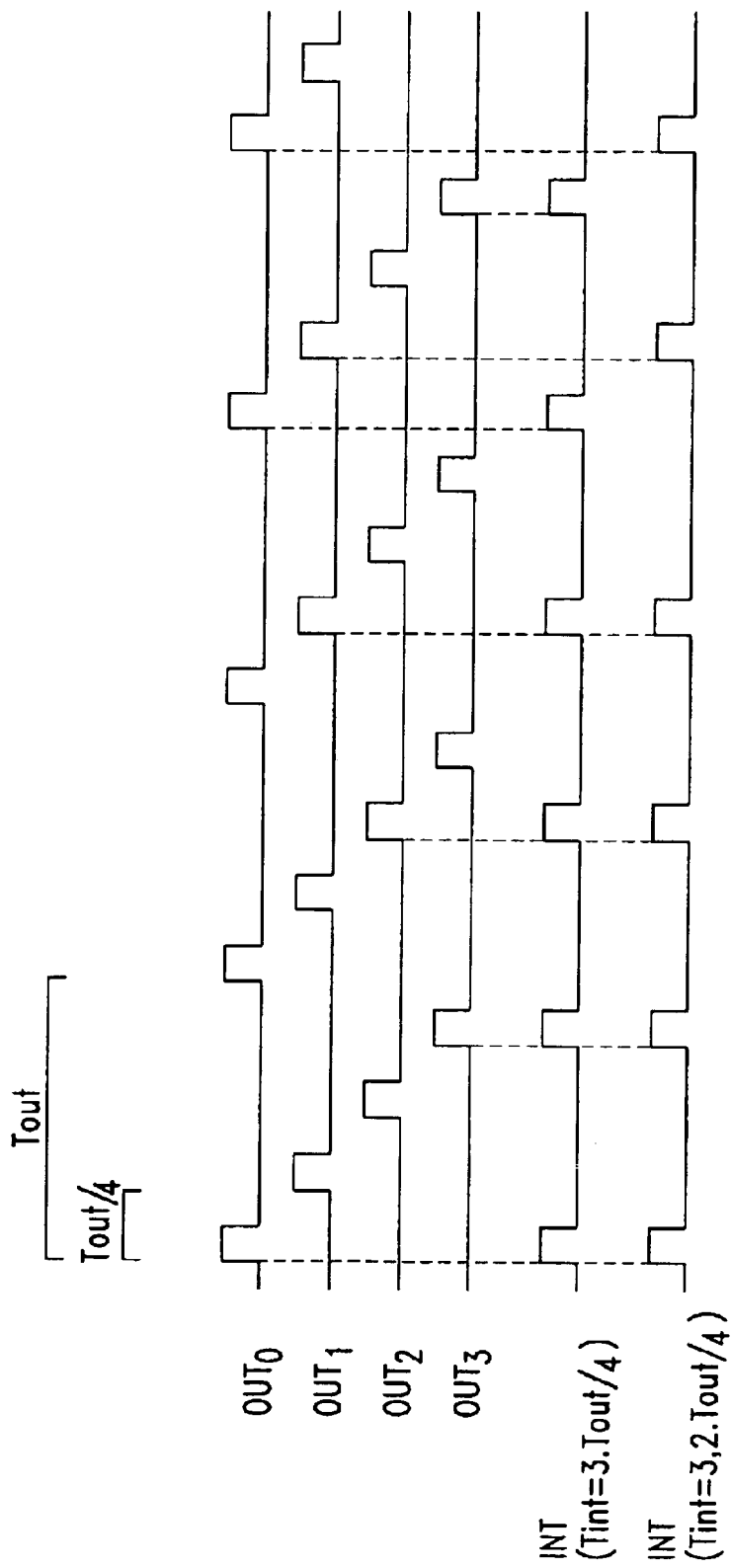
FIG. 3 illustrates the control of the multiplexer of FIG. 2.

FIG. 3 illustrates an example of control of multiplexer 12 of FIG. 2 by modulator 14. For clarity, it is considered in FIG. 3 that voltage-controlled oscillator 10 comprises four outputs only and that modulator 14 performs a so-called sigma/delta modulation of order 1. In practice, the oscillator will comprise a larger number of outputs, for example, 32, and the sigma/delta modulation will be of higher order. The oscillator respectively generates on its four outputs four signals $OUT_0$, $OUT_1$, $OUT_2$, and $OUT_3$ of same period Tout. Signals $OUT_1$, $OUT_2$, and $OUT_3$ are respectively delayed by Tout/4, 2Tout/4, and 3Tout/4 with respect to signal $OUT_0$. Each of signals $OUT_0$, $OUT_1$, $OUT_2$, and $OUT_3$ consists in a periodic pulse of duration smaller than duration Tout/4. The average period Tint of signal INT generated by multiplexer 12 is, according to above equation (1):

$$Tint=Tout.(M+x/2^u)/4$$

The fifth line of FIG. 3 illustrates a first example in which Tint=3.Tout/4. Modulator 14 has been programmed with values M=3 and x=0. Multiplexer 12 is thus controlled to provide a first pulse, here a pulse of signal $OUT_0$, then to provide the pulse of that of signals $OUT_0$, $OUT_1$, $OUT_2$, and $OUT_3$ which is delayed by a duration equal to Tout.¾ with respect to signal $OUT_0$, here, signal $OUT_3$. Similarly, multiplexer 12 is then successively controlled to provide a pulse of signal $OUT_2$, then $OUT_1$, then $OUT_0$ again, and so on.

The sixth line of FIG. 3 illustrates a second example in which Tint=(3,2).Tout/4. The modulator has been programmed with values M=3 and x such that $x/2^u$=0.2=⅕. Multiplexer 12 is thus controlled to provide four times out of five signal pulses delayed with respect to one another by a duration equal to 3Tout/4, and one time out of five a signal pulse delayed by a duration equal to 4Tout/4 with respect to the preceding provided signal. The multiplexer thus successively provides series of pulses coming from signals $OUT_0$, $OUT_3$, $OUT_2$, $OUT_1$ and $OUT_1$.

The noise, also called "structural jitter", introduced by the sigma/delta modulation in comparator 2 depends on the used modulation order. For a modulation of order 1 such as illustrated in FIG. 3, the period of signal INT takes, when the phase-locked loop is stabilized, either instantaneous value Tout.M/n, or instantaneous value Tout.(M+1)/n. The maximum jitter J introduced in the loop is thus equal to: J=Tout/n, that is, referring back to formula (2), to:

$$J=Tref/(N.(M+x/2^u))$$

Similarly, the phase error ε introduced in comparator 2 will be such that:

$$-Tout/n \leq \epsilon \leq 0$$

It can be shown that for a sigma/delta modulation of order 2, in which the period of signal INT takes one of instantaneous values Tout.(M−1)/n, Tout.M/n, Tout.(M+1)/n, or Tout.(M+2)/n, jitter J introduced as an input of comparator 2 will be such that:

$$J=3.Tref/(N.(M+x/2^u))$$

It can also be shown that for such a modulation, the phase error introduced in comparator 2 will be such that:

$$-2.Tout/n \leq \epsilon \leq Tout/n$$

If a phase-locked loop according to the present invention is compared with a conventional phase-locked loop such as shown in FIG. 1, in which value N varies according to a sigma/delta modulation of order 2, it can be shown that, for an equal accuracy and for an equal output frequency, the jitter introduced in a phase-locked loop according to the present invention is n times smaller than the jitter introduced in the conventional loop. It can also be shown that the variation of the control voltage introduced by phase error ε is n times less significant for a phase locked loop according to the present invention than for the conventional loop. As a result, comparator 2 of the phase-locked loop according to the present invention comprises a filter, the capacitors of which can be substantially smaller than the prior designs. In one embodiment, the capacitors are approximately n times smaller than in the conventional loop.

Of course, the present invention is likely to have various alterations, modifications, and improvements which will readily occur to those skilled in the art. In particular, the present invention has been described in relation with sigma/delta modulations of order 1 or 2, but it will readily adapt to modulations of higher order.

A phase-locked loop according to the present invention has been described as comprising certain specific elements, but the present invention will readily adapt to phase-locked loops comprising equivalent elements. As an example, the voltage-controlled oscillator having several shifted-shifted outputs of FIG. 2 may be replaced with an oscillator providing a single output to a delay line generating the phase-shifted outputs. Similarly, the voltage-controlled oscillator and the multiplexer controlled by a sigma/delta modulator may be replaced with a frequency multiplier having an equivalent operation.

The present invention has been described in relation with a sigma/delta modulator programmed by two values respectively representing the integral part and the decimal part of the factor of the frequency multiplication controlled by the modulator, but it will readily adapt to a sigma/delta modulator programmed by a single control value directly representing an integral value of the factor of the frequency multiplication controlled by the modulator.

The present invention has been described in relation with a voltage-controlled oscillator generating a number n of phase-shifted signals consisting in a periodic pulse of duration smaller than duration Tout/n, but those skilled in the art will readily adapt the present invention to a voltage-controlled oscillator generating a number n of phase-shifted signals consisting in a periodic pulse of longer duration.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A phase-locked loop comprising:
    a comparator generating a control voltage depending on the phase-shift between a predetermined reference signal and a feedback signal;
    an oscillator controlled by the control voltage, generating a plurality of phase-shifted signals of same period, one of the phase-shifted signals forming the output signal of the phase-locked loop;
    a multiplexer capable of providing any of the phase-shifted signals to the input of a divider, the output of which forms the feedback signal; and
    control means controlling the multiplexer to successively provide predetermined fractions of some of the phase-shifted signals, so that the divider, having a fixed predetermined dividing ratio (N), receives a signal having an average period equal to a real fraction of the period of the phase-shifted signals.

2. The phase-locked loop of claim 1 wherein the voltage-controlled oscillator generates a number n of phase-shifted signals of same period Tout so that the phase-shifted signal forming the output signal of the loop is ahead of each of the other phase-shifted signals by a duration equal to an integral multiple of a duration Tout/n, each of the phase-shifted signals consisting in a periodic pulse having a duration shorter than duration Tout/n.

3. The phase-locked loop of claim 2 wherein the control means is a sigma/delta modulator controlling the multiplexer so that the divider receives a signal, the average period (Tint) of which is equal to the sum of duration Tout/n multiplied by a first programmable Integer M ranging between 0 and n−1 and of duration Tout/n multiplied by a second programmable integer x coded over a number u of bits and divided by $2^u$.

4. The phase-locked loop of claim 1 wherein the period of the signals generated by the oscillator depends on the control voltage.

5. The phase-locked loop of claim 1 wherein the comparator comprises:
    a phase detector receiving as an input the reference signal and the feedback signal;
    a change pump coupled to the output of the phase detector, generating a current signal depending on the phase difference between the reference and feedback signals; and
    a filter generating the control voltage based on the current signal.

* * * * *